(12) United States Patent
Castañeda

(10) Patent No.: US 11,841,553 B2
(45) Date of Patent: *Dec. 12, 2023

(54) EYEWEAR HAVING CUSTOM LIGHTING

(71) Applicant: Snap Inc., Santa Monica, CA (US)

(72) Inventor: Julio Cesar Castañeda, Venice, CA (US)

(73) Assignee: Snap Inc., Santa Monica, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/725,190

(22) Filed: Apr. 20, 2022

(65) Prior Publication Data
US 2022/0244575 A1    Aug. 4, 2022

Related U.S. Application Data

(63) Continuation of application No. 17/187,825, filed on Feb. 28, 2021, now Pat. No. 11,353,724, which is a
(Continued)

(51) Int. Cl.
*G02C 11/04* (2006.01)
*F21V 23/00* (2015.01)
(Continued)

(52) U.S. Cl.
CPC ............ *G02C 11/04* (2013.01); *F21V 23/005* (2013.01); *F21V 23/0478* (2013.01); *F21V 23/0485* (2013.01); *G02C 11/10* (2013.01); *H05K 1/189* (2013.01); *F21V 21/084* (2013.01); *F21V 33/0008* (2013.01); *F21Y 2113/13* (2016.08);
(Continued)

(58) Field of Classification Search
CPC ....... G02C 11/04; G02C 11/10; F21V 21/084; F21V 23/005; F21V 23/0478; F21V 23/0485; F21V 33/0008; H05K 1/189; H05K 2201/10106; H05K 2201/0999; F21Y 2115/10
See application file for complete search history.

(56) References Cited

U.S. PATENT DOCUMENTS

| 4,254,451 A | 3/1981 | Cochran, Jr. |
| 6,824,265 B1 | 11/2004 | Harper |

(Continued)

FOREIGN PATENT DOCUMENTS

| CN | 107526185 A | * 12/2017 | ............. G02C 11/10 |
| CN | 109791346 B | * 4/2021 | ............. G02C 11/04 |

OTHER PUBLICATIONS

Hanover M., "Glasses Device Mode Indication", Apr. 20, 2021, CN 109791346 B with merged machine English translation text. (Year: 2021).*

(Continued)

*Primary Examiner* — Alan B Cariaso
(74) *Attorney, Agent, or Firm* — Culhane Meadows PLLC; Stephen J. Weed

(57) ABSTRACT

An embodiment includes eyewear having an optical element, electronic components, a support structure configured to support the optical element and the electronic components, and light emitting diodes (LEDs) coupled to the electronic components and supported by the support structure. The LEDs are positioned to illuminate the support structure according to a lighting scheme.

20 Claims, 12 Drawing Sheets

Related U.S. Application Data continuation of application No. 16/285,307, filed on Feb. 26, 2019, now Pat. No. 10,935,815.

(60) Provisional application No. 62/639,039, filed on Mar. 6, 2018.

(51) Int. Cl.
  *H05K 1/18* (2006.01)
  *F21V 23/04* (2006.01)
  *G02C 11/00* (2006.01)
  *F21Y 115/10* (2016.01)
  *F21Y 113/13* (2016.01)
  *F21V 33/00* (2006.01)
  *F21V 21/084* (2006.01)

(52) U.S. Cl.
  CPC ... *F21Y 2115/10* (2016.08); *H05K 2201/0999* (2013.01); *H05K 2201/10106* (2013.01)

(56) References Cited

U.S. PATENT DOCUMENTS

| | | | |
|---|---|---|---|
| 7,438,409 B2 | 10/2008 | Jordan et al. | |
| 8,514,097 B2 | 8/2013 | Boise | |
| 8,545,012 B2 | 10/2013 | Waters | |
| 9,618,193 B1 | 4/2017 | Lord | |
| 9,977,265 B2 | 5/2018 | Shiratori et al. | |
| 10,415,765 B1 | 9/2019 | Grandadam | |
| 10,935,815 B1* | 3/2021 | Castañeda | F21V 23/0478 |
| 11,353,724 B2* | 6/2022 | Castañeda | G02C 11/04 |
| 2004/0114359 A1 | 6/2004 | Parsons et al. | |
| 2006/0007390 A1 | 1/2006 | Lin | |
| 2006/0132382 A1 | 6/2006 | Jannard | |
| 2007/0013865 A1 | 1/2007 | Jordan et al. | |
| 2007/0200998 A1 | 8/2007 | Schrimmer et al. | |
| 2011/0205484 A1 | 8/2011 | Huang | |
| 2012/0224358 A1 | 9/2012 | Noble et al. | |
| 2012/0229248 A1 | 9/2012 | Parshionikar et al. | |
| 2013/0300636 A1 | 11/2013 | Cunningham et al. | |
| 2014/0160421 A1 | 6/2014 | Kavana | |
| 2014/0259271 A1 | 9/2014 | Cox et al. | |
| 2015/0036204 A1 | 2/2015 | Branda et al. | |
| 2016/0033792 A1 | 2/2016 | Blum et al. | |
| 2017/0198873 A1 | 7/2017 | Ashmore et al. | |

OTHER PUBLICATIONS

Cui Ting-ting et al., "An Outdoor Riding Multifunctional Intelligent Glasses", Dec. 29, 2017, CN 107526185 A with merged machine English translation text. (Year: 2017).*

* cited by examiner

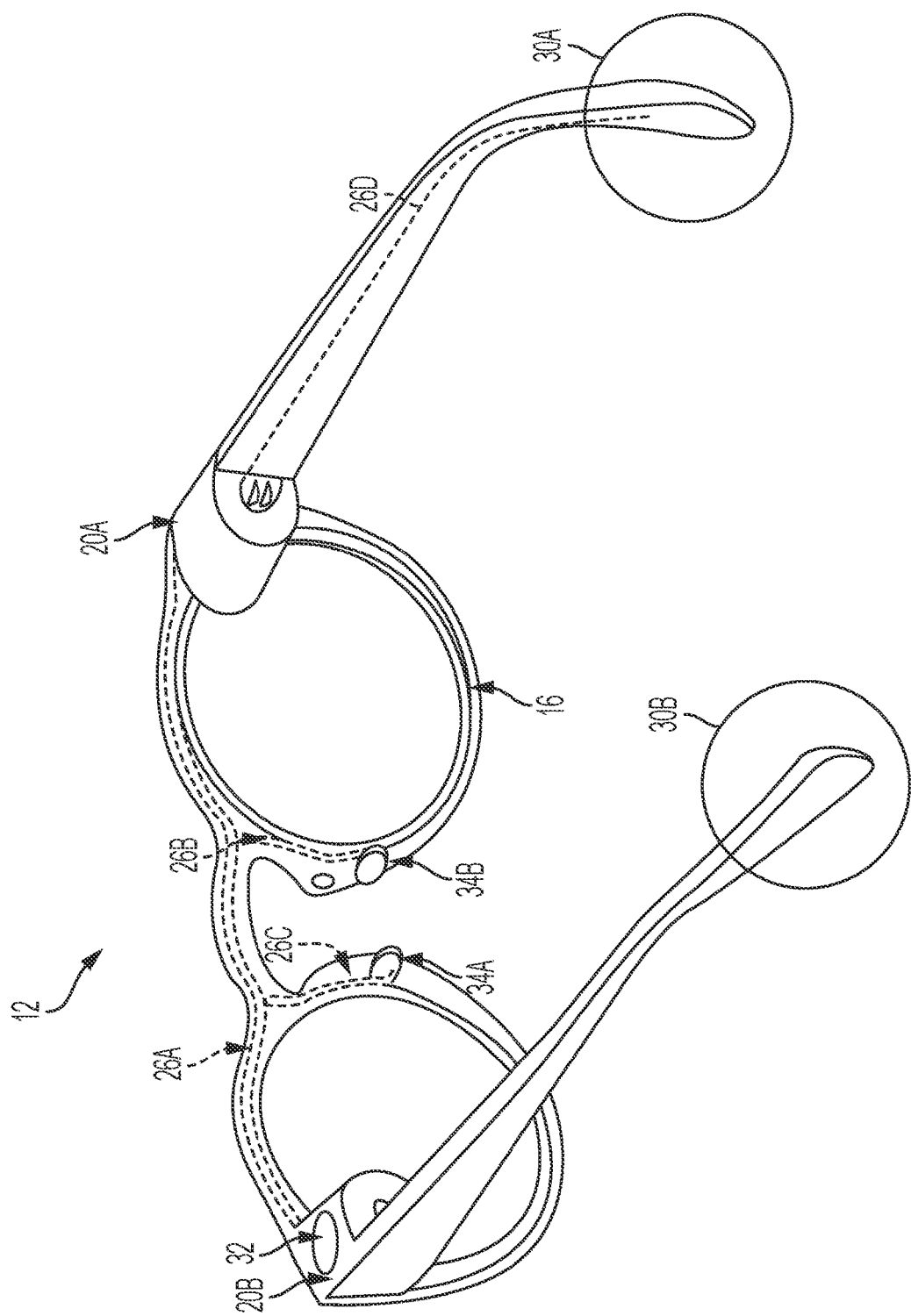

EYEWEAR HAVING CUSTOM LIGHTING

CROSS-REFERENCE TO RELATED APPLICATIONS

This application is a continuation of U.S. patent application Ser. No. 17/187,825 filed Feb. 28, 2021, which is a continuation of U.S. patent application Ser. No. 16/285,307 filed Feb. 26, 2019, which claims priority under 35 U.S.C. § 119(e) to U.S. Provisional Patent Application No. 62/639,039 filed on Mar. 6, 2018, all of which are incorporated by reference in their entireties.

FIELD

The subject matter disclosed herein generally relates to eyewear and, more particularly, to eyewear having custom lighting.

BACKGROUND

A large portion of the world's population wears eyewear. Eyewear may include prescription glasses, sunglasses and smart glasses among others. Although functionality is an important aspect of eyewear, aesthetics is also important. In fact, many users select and customize their eyewear in large part based on fashion and pop-culture trends.

BRIEF DESCRIPTION OF THE FIGURES

FIG. 1C is another perspective view of the eyewear example of FIG. 1A.

DETAILED DESCRIPTION

Figure 1A:
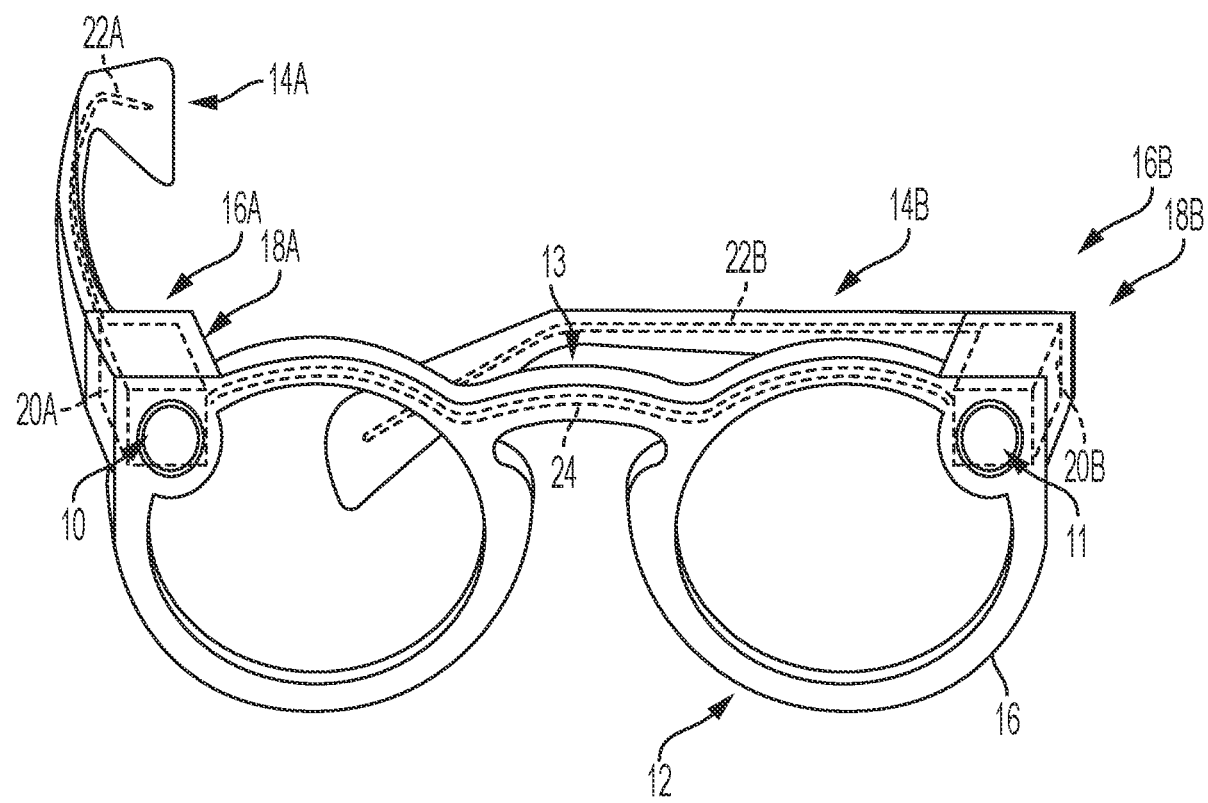
FIG. 1A is a perspective view of an eyewear example including electronic components and a support structure supporting the electronic components.

In the following detailed description, numerous specific details are set forth by way of examples in order to provide a thorough understanding of the relevant teachings. However, it should be apparent to those skilled in the art that such details are not necessary to practice the present teachings. In other instances, a relatively high-level description, without detail, of well-known methods, procedures, components, and circuitry avoids unnecessarily obscuring aspects of the present teachings.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate or carry the light or signals.

The orientations of the eyewear, associated components, and any devices incorporating an LED such as shown in any of the drawings, are by way of example only, for illustration and discussion purposes. In operation, orientation of the eyewear may be in other directions suitable to the particular application of the eyewear, for example up, down, sideways, or any other orientation. Also, any directional term, such as front, rear, inwards, outwards, towards, left, right, lateral, longitudinal, up, down, upper, lower, top, bottom and side, is exemplary, and not limiting, as to direction or orientation.

Example eyewear has an optical element, electronic components, a support structure configured to support the optical element and the electronic components, and light-emitting diodes (LEDs) coupled to the electronic components and supported by the support structure. The LEDs position and orientation illuminates the support structure according to a lighting scheme.

Example methods for illuminating eyewear according to a lighting scheme include detecting, by electronic components in a support structure of the eyewear, a trigger signal instructing the electronic components to illuminate LEDs in the support structure. In response to receiving the trigger, illuminating, by the electronic components, the LEDs in the support structure according to a lighting scheme.

Custom lighting of eyewear is beneficial for various reasons. In one example, custom lighting enables the eyewear to indicate functionality to the user and/or to bystanders. This functionality may include, but is not limited to, indicating to the user and/or bystanders that the eyewear is capturing an image or capturing video (i.e., the custom lighting synchronizes with the camera operation). In another example, custom lighting enables the eyewear to display a lighting pattern that is aesthetically pleasing to the user and/or the bystanders. In this example, users can customize a lighting pattern by selecting colors, flashing patterns, etc. The benefits of custom lighting are therefore both functionally and aesthetically desirable to eyewear users. As used herein, the term "eyewear" refers to any smart optical device having a support structure worn by a user including but not limited to smart glasses, smart goggles, and display screens.

FIG. 1A depicts a front perspective view of example eyewear 12 for providing custom lighting. The illustrated eyewear 12 includes a support structure 13 that has temples 14A and 14B and a frame 16. Eyewear 12 additionally include articulated joints 18A and 18B, electronic components 20A and 20B, and core wires 22A, 22B and 24.

Support structure 13 supports one or more optical elements within a field of view of a user when worn by the user. For example, frame 16 supports the one or more optical elements. As used herein, the term "optical elements" refers to lenses, transparent pieces of glass or plastic, projectors, screens, displays and other devices for presenting visual images or through which a user perceives visual images. In an embodiment, respective temples 14A and 14B connect to frame 16 at respective articulated joints 18A and 18B. The illustrated temples 14A and 14B are elongate members having core wires 22A and 22B extending longitudinally therein.

Temple 14A is illustrated in a wearable condition and temple 14B is illustrated in a collapsed condition in FIG. 1A. As shown in FIG. 1A, articulated joint 18A connects temple 14A to a right end portion 16A of frame 16. Similarly, articulated joint 18B connects temple 14B to a left end portion 16B of frame 16. The right end portion 16A of frame 16 includes a housing that carries electronic components 20A therein, and left end portion 16B includes a housing that carries electronic components 20B therein.

A plastics material or other material embeds core wire 22A, which extends longitudinally from adjacent articulated joint 18A toward a second longitudinal end of temple 14A. Similarly, the plastics material or other material also embeds core wire 22B, which extends longitudinally from adjacent articulated joint 18B toward a second longitudinal end of temple 14B. The plastics material or other material additionally embeds core wire 24, which extends from the right end portion 16A (terminating adjacent electronic components 20A) to left end portion 16B (terminating adjacent electronic components 20B).

Electronic components 20A and 20B are carried by support structure 13 (e.g., by either or both of temple(s) 14A, 14B and/or frame 16). Electronic components 20A and 20B include a power source, power and communication related circuitry, communication devices, display devices, a computer, a memory, modules, and/or the like (not shown). Electronic components 20A and 20B may also include a camera/microphone 10 for capturing images and/or videos, and indicator LEDs 11 indicating the operational state of eyewear 12.

In one example, temples 14A and 14B and frame 16 are constructed of a plastics material, cellulosic plastic (e.g., cellulosic acetate), an eco-plastic material, a thermoplastic material, or the like, with core wires 22A, 22B and 24 embedded therein. Core wires 22A, 22B and 24 provide structural integrity to support structure 13 (i.e., temple(s) 14A, 14B and/or frame 16). Additionally, core wires 22A, 22B and/or 24 act as a heat sink to transfer heat generated by electronic components 20A and 20B away therefrom so as to reduce the likelihood of localized heating adjacent electronic components 20A and 20B. As such, core wires 22A, 22B and/or 24 thermally couple to the heat source to provide a heat sink for the heat source. Core wires 22A and 22B and/or 24 include relatively flexible conductive metal or metal alloy material such as one or more of an aluminum, an alloy of aluminum, alloys of nickel-silver, and a stainless steel, for example.

Figure 1B:
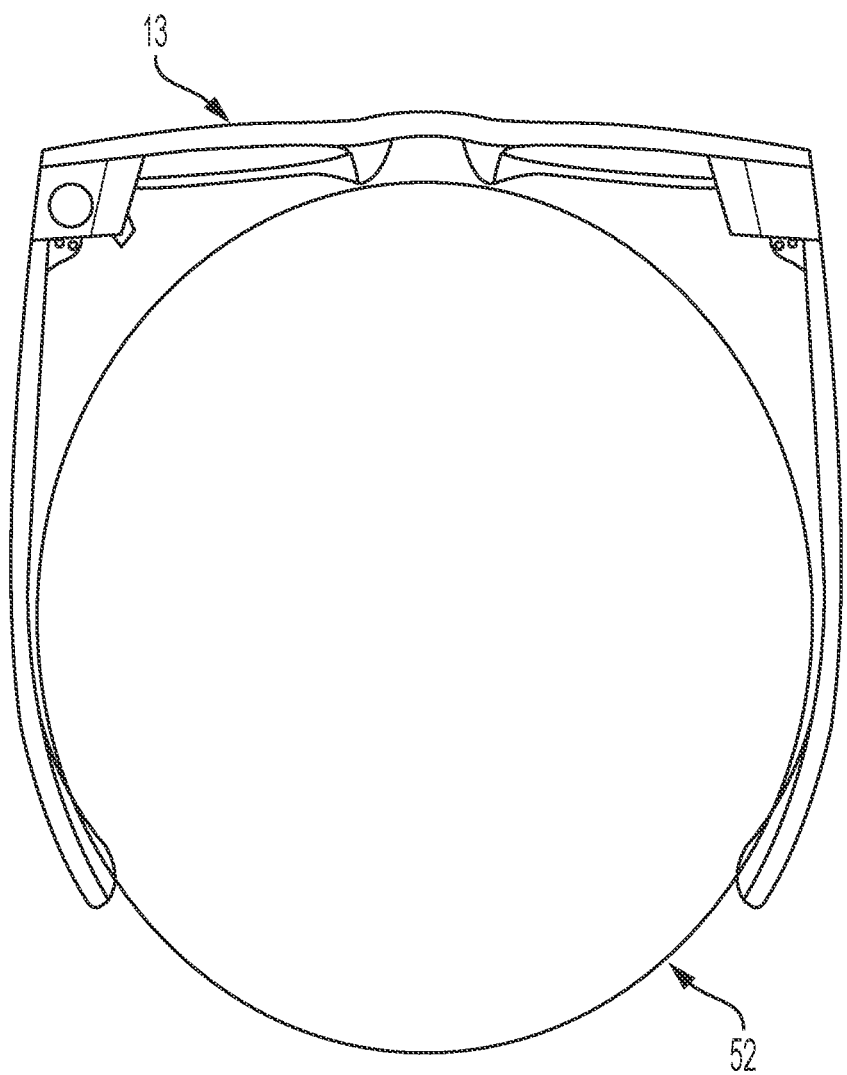
FIG. 1B is a top view of the eyewear example of FIG. 1A illustrating a region defined by the eyewear for receiving a head of a user wearing the eyewear.

Support structure 13 defines a region (e.g., region 52 (FIG. 1B) defined by frame 12 and temples 14A and 14B) for receiving a portion 52 (e.g., the main portion) of the head of the user. The defined region(s) are one or more regions containing at least a portion of the head of a user that are encompassed by, surrounded by, adjacent, and/or near the support structure when the user is wearing eyewear 12. Eyewear 12 may also include light emitting diodes (LEDs) (not shown) for illuminating support structure 13 and internal circuit boards for coupling to the electronic components and LEDs.

FIG. 1C depicts a perspective view of eyewear 12 with a transparent frame 16 for illustration purposes. Eyewear 12 includes electronics 20A and 20B (e.g., camera, microphone, wireless transceiver, etc.). In addition, eyewear 12 includes LEDs (not shown) installed at one or more locations throughout frame 16 and/or temples 14A and 14B. For example, LEDs are located at installation locations in at least one of nose pads 34A and 34B, the housing of electronics 20A, temple areas 30A and 30B, etc. These LEDs may include multicolor LEDs, or the like, that are electrically coupled to electronics 20A and 20B (e.g., through one or more flexible printed circuit boards (FPCBs)).

FPCBs, as shown in FIG. 1C, are routed through various portions of frame 16 and temples 14A and 14B to electrically couple these electronics 20A and 20B to the LEDs. For example, as shown in FIG. 1C, FPCB 26A (primary FPCB) routes through frame 16 to electrically couple electronics 20A and 20B together. Other FPCBs (secondary FPCB) route through the frame and temples. For example, secondary FPCBs 26B and 26C extend from main FPCB 26A to nose pad 34B. In another example, FPCB 26D extends from electronics 20A to temple area 30A. Although not shown, another FPCB extends from electronics 20B to temple area 30B. The use of secondary FPCBs allow embedding of other electronic devices (e.g., LEDs and the like) at various locations throughout the structure of eyewear 12. The LED positions provide a way to illuminate selectively eyewear 12 (e.g., in accordance with a lighting scheme).

FPCBs 26A, 26B, 26C and 26D shown in FIG. 1C include one or more electrical traces for routing electrical signals between the electronic components and the LEDs. A molding process may embed these FPCBs into the frame and temples of eyewear 12 during manufacturing. For example, during a first shot of a two-shot molding process, an injection-molding device injects plastic into a mold to form the front half of frame 16 and/or temple 14A. After forming the front halves, a robotic device may insert and position the FPCBs and other electronic components (e.g., the LEDs) within the mold at locations with respect to the front halves. During a second shot of the two-shot molding process, the injection molding device injects more plastic into the mold to cover the components and form the back half of frame 16 or temple 14A such that the FPCBs and electronics are embedded between the front and back halves of frame 16 and/or temple 14A. After forming the frame and both temples using the molding process, the temples are mechanically connected to the frame (e.g., with screws) to form the finished eyewear 12.

Wires, PCBs, and FPCBs throughout the eyewear accomplish the various electrical couplings between controller 100 and the other electronic components including the LEDs. These electrical couplings are routed through various portions of frame 16 and/or temples 14A and 14B during the manufacturing (e.g., two-shot molding) process. Manufacturing of eyewear 12 fully embeds these electrical couplings in the eyewear such that they may or may not be visible to the user based on the opacity of the manufacturing material.

Embedding LEDs into frame 16 and/or temples 14A and 14B enable illumination of the eyewear by the LEDs. The positioning and orientation of various types of LEDs or other light sources with respect to frame 16 and/or temples 14A and 14B enables illumination in accordance with multiple different lighting schemes.

Figure 1D:
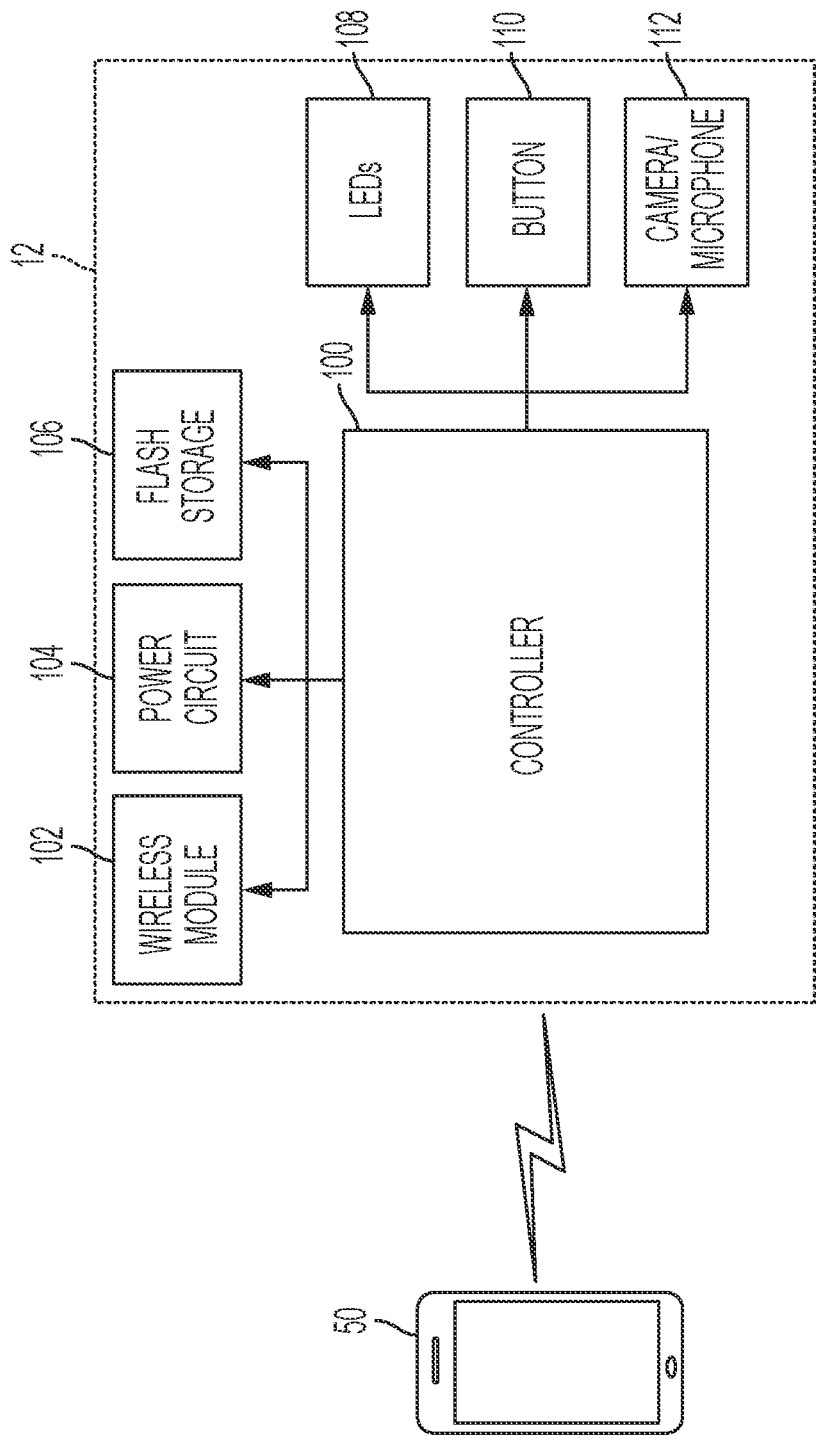
FIG. 1D is a block diagram of an example of the electronic components supported by the eyewear example of FIG. 1A.

FIG. 1D is a block diagram of example electronic components 20A and 20B coupled to a LEDs 108. The illustrated electronic components 20A and 20B include controller 100 (e.g., lower power processor, image processor, etc.) for controlling the various devices in eyewear 12; wireless module (e.g., Bluetooth™) 102 for facilitating communication between eyewear 12 and a client device (e.g., smartphone not shown); power circuit 104 (e.g., battery, filter, etc.) for powering eyewear 12; flash storage 106 for storing data (e.g., images, video, image processing software, etc.);

LEDs 108 (e.g., multicolored LEDs) for presenting information and aesthetic characteristics to the user and/or bystanders; button 110 (e.g., momentary push button) for triggering eyewear 12 to capture images/video; and camera/microphone 112 for capturing images/video and sound.

Wireless module 102 may couple with a client device such as a smartphone, tablet, phablet, laptop computer, desktop computer, networked appliance, access point device, or any other such device capable of connecting with wireless module 102. Bluetooth, Bluetooth LE, Wi-Fi, Wi-Fi direct, a cellular modem, and a near field communication system, as well as multiple instances of any of these systems, for example, may implement these connections to enable communication there between. For example, communication between the devices may facilitate transfer of software updates, images, videos, lighting schemes, and/or sound between eyewear 12 and the client device (e.g., smartphone or other personal computing device uploading one or more lighting schemes to eyewear 12).

Camera/microphone 112 for capturing the images/video may include digital camera elements such as a charge-coupled device, a lens, or any other light capturing elements for capturing image data and converting into an electrical signal(s). Camera/microphone 112 may additionally or alternatively include a microphone having a transducer for converting sound into an electrical signal(s).

Button 110 may be a physical button (e.g., button 32 (FIG. 1C)) that, when pressed, sends a user input signal to controller 100. Controller 100 may interpret pressing button 110 for a predetermined period of time (e.g., three seconds) as a request to turn on eyewear 12 (e.g., transition eyewear 12 from an off or sleep mode of operation to a low power mode of operation).

Controller 100 is a controller that controls the electronic components. For example, controller 100 includes circuitry to receive signals from camera 112 and process those signals into a format suitable for storage in memory 106. Controller 100 powers on and boots to operate in a normal operational mode, or to enter a sleep mode. In one example, controller 100 includes a microprocessor integrated circuit (IC) customized for processing sensor data from camera 112, along with volatile memory used by the microprocessor to operate. The memory may store software code for execution by controller 100.

Each of the electronic components require power to operate. Power circuit 104 may include a battery, power converter, and distribution circuitry (not shown). The battery may be a rechargeable battery such as lithium-ion or the like. Power converter and distribution circuitry may include electrical components for filtering and/or converting voltages for powering the various electronic components.

LEDs 108, under control of controller 100 and in accordance with a lighting scheme controller 100 is implementing, act as indicators on eyewear 12 indicating one or more functions to the user and/or to bystanders. For example, controller 100 may illuminate LEDs 108 each time the user presses button 110 to indicate that eyewear 12 is recording images and/or video and/or sound.

Locations of LEDs 108 may include the nose pad, frame, or temple of eyewear 12. Controller 100 of eyewear 12 may automatically control the operation of LEDs 108 to illuminate eyewear 12 in accordance with a lighting scheme. In one example, LEDs 108 (positioned in the frame of eyewear 12) may be multi-colored LEDs that controller 100 controls to emit a distinct lighting pattern in accordance with a lighting scheme. The lighting pattern may include different colors across the color spectrum, flashing or blinking patterns, and/or duration of illumination. Controller 100 or a personal computing device (e.g., smartphone) controls the lighting pattern of LEDs 108 based on a lighting pattern selected by an application, a user, or a combination thereof. For example, an application executing on smartphone 50 may allow a user to select a lighting pattern for eyewear 12. The user can select a color, pattern, and/or other factors to customize the lighting pattern. Smartphone 50 may the communicate this lighting pattern to eyewear 12. Eyewear 12 then illuminates the eyewear (e.g., support structure) according to the customized lighting pattern. The illumination of eyewear 12 may also be constant or triggered by some action. For example, if the user presses button 32 to capture a video, this may trigger the controller to illuminate the eyewear 12 in a distinctive manner. Controller 100 may also control LEDs to illuminate according to a distinctive lighting pattern when capturing video. This functionality acts as an indicator to let bystanders know the camera is recording them, and provides the aesthetic characteristics desired by the user.

Wires, PCBs and FPCBs throughout the eyewear accomplish the various electrical couplings between controller 100 and the other electronic components including LEDs 108 shown in FIG. 1D. These electrical couplings route through various portions of frame 16 and/or temples 14A and 14B during the manufacturing (e.g., two-shot molding) process. The manufacturing process fully embeds the electrical couplings into eyewear 12 such that they may or may not be visible to the user based on the opacity of the manufacturing material.

Figure 2:
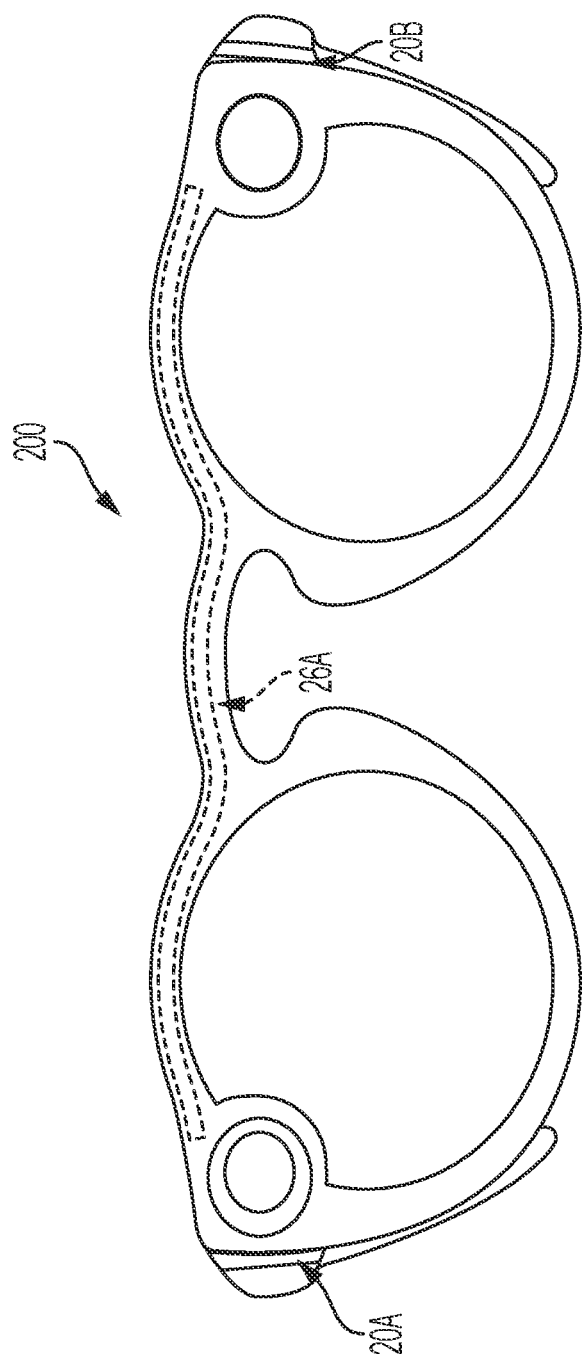
FIG. 2 is a front view of the eyewear example of FIG. 1A.

FIG. 2 is a front view of eyewear 12 in FIG. 1C showing FPCB 26A routed through the frame. FPCB 26A is the primary FPCB in eyewear 12, and electrically couples electronics 20A with electronics 20B. During operation, controller 100 (e.g. located in electronics 20A) uses FPCB 26A to control camera 112 (e.g. located in electronics 20B). Although not shown in FIG. 2, LEDs 108 are also electrically coupled to FPCB 26A.

Figure 3:
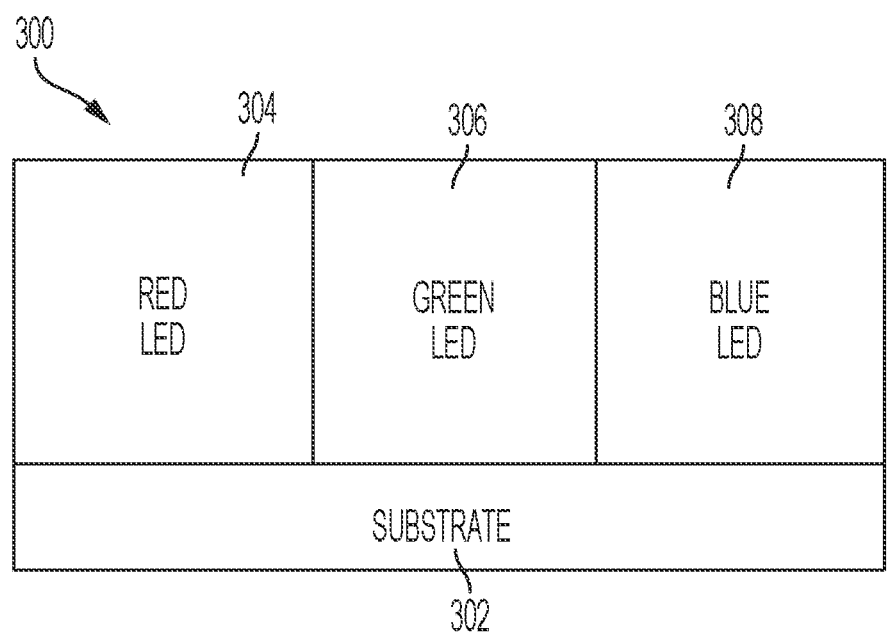
FIG. 3 is a multicolor LED for positioning on the eyewear example in FIG. 1A.

LEDs 108 may include surface mount multicolor LEDs as shown in FIG. 3. Multicolor LED 300 in FIG. 3 includes four basic components. These components include a red colored LED 304, a green colored LED 306, and a blue colored LED 308 mounted (e.g. soldered, adhered, etc.) to a substrate 302 through separate control terminals. Although not shown, substrate 302 includes electrical contacts for making electrical couplings to traces in the FPCB. Alternatively, LEDs 108 may be single color LEDs (e.g., red, green, or blue).

During operation, controller 100 controls multicolor LED 300 in FIG. 3. Controller 100 applies three separate control signals to the separate control terminals of LED 300. A first control signal controls the intensity of the red LED. A second control signal controls the intensity of the blue LED. A third control signal controls the intensity of the green LED. Controller 100 controls LED 300 to produce a desired output color at a desired intensity by regulating the intensity of the respective control signals. For example, if controller 100 wants to illuminate the eyewear with red light, then controller only applies a control signal to illuminate the red LED. In contrast, if controller 100 wants to illuminate the eyewear with blue light, then controller only applies a control signal to illuminate the blue LED. If controller 100 wants to illuminate the eyewear with green light, then controller only applies a control signal to illuminate the green LED. If controller 100 wants to illuminate the eyewear with any other light, controller 100 mixes the colors. For example, if purple is desired, controller 100 applies control signals to simultaneously illuminate the red LED and the blue LED. The blue and red light optically mix together to produce a purple light visible to the user. Other colors are possible by mixing the red, green and blue light at appropriate relative intensities.

FPCBs provide a way to position one or more LEDs 300 at various locations throughout eyewear 12. In one example, FPCBs uniformly position the LEDs 300 throughout the frame and couple the LEDs 300 to the controller 100. A light tube may optically couple light from the LEDs 300 throughout the eyewear for even distribution of the light. Additionally, although not shown in FIG. 2, other FPCBs may be placed at other locations of the frame (e.g., around the optical lenses), and within temples 14A and 14B.

Figure 4A:
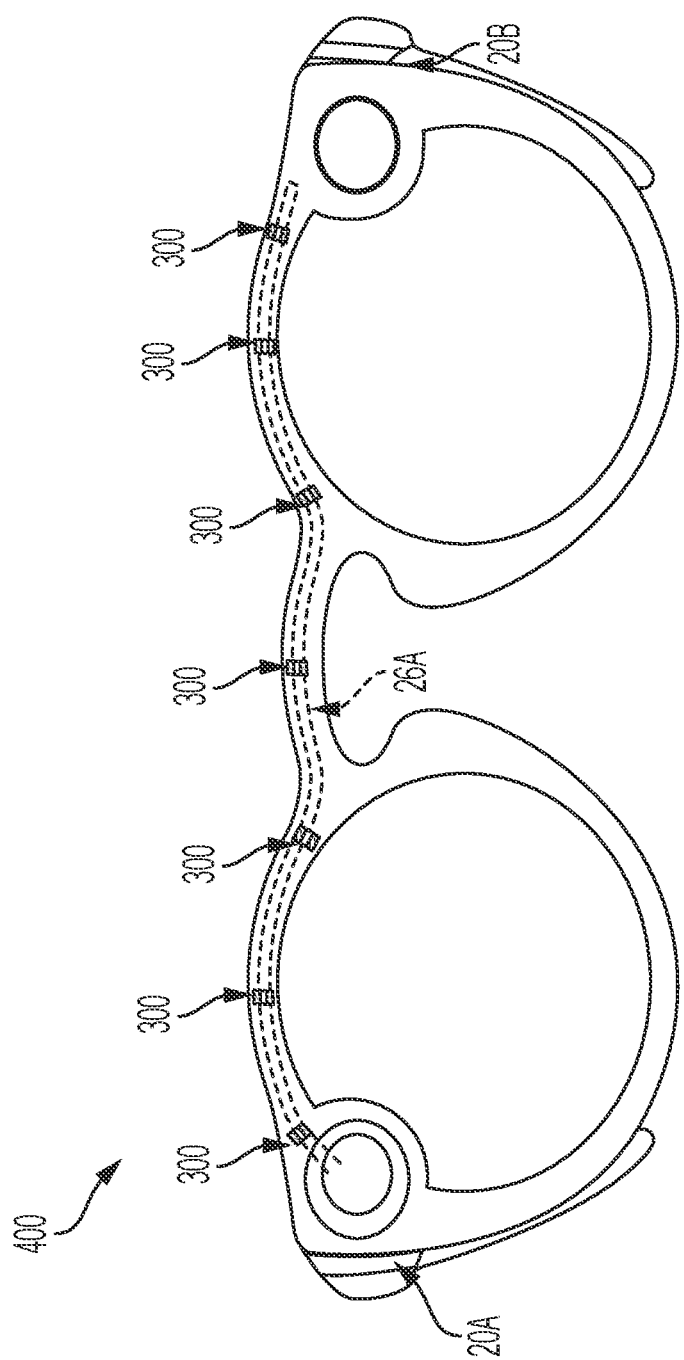
FIG. 4A is a front view of the eyewear example of FIG. 1A showing LEDs positioned in the frame.

As described above, LEDs 300 are located at various positions on eyewear 12. One such location is on frame 16. An example of this configuration is shown in FIG. 4A which depicts a close-up partial view of eyewear 12 in FIG. 1C, where secondary FPCB 26A extends from electronic devices 20A to electronic devices 20B. Multiple LEDs 300 are positioned in the frame and are electrically coupled to FPCB 26A. The manufacturer based on various factors including but not limited to cost, LED size, frame size, FPCB size, and/or uniformity of illumination may determine the installation distance between LEDs 300.

For example, FIG. 4A shows eyewear 400 including seven LEDs 300. These LEDs are located at positions in an upper portion (e.g., brow) of frame 16. In this example, LEDs 300 are spaced apart from one another to evenly distribute the emitted light across the surface of frame 16. The manufacturer may choose the number of LEDs and spacing of the LEDs to produce the desired optical effect. Although not shown in FIG. 4A, LEDs 300 could extend to other portions of frame 16, including, but not limited to the nose pad region and other regions surrounding the optical lenses.

In addition to spacing, LEDs may be oriented to direct light in a specific direction to implement a desired lighting scheme. FIG. 4A shows an example where LEDs 300 are oriented to face the front portion of frame 16 (i.e., aimed away from the user's face). This orientation is beneficial for illuminating frame 16 so that the illumination is easily visible to bystanders.

LEDs 300 in FIG. 4A are electrically coupled to controller 100 via FPCB 26A, which extends across the brow portion of frame 16. These electrical couplings may include one or more traces (e.g., one trace common to every red LED, one trace common to every green LED, and one trace common to every blue LED) or individual traces (e.g., an exclusive trace for each red LED, an exclusive trace for each green LED, and an exclusive trace for each blue LED) on FPCB 26A. A common trace would be the least costly and least complex. However, a common trace would require that all LEDs 300 turn ON and OFF simultaneously, as well as illuminate at the same brightness and color; or addressable LEDs that would increase cost. Individual traces, however, allow LEDs 300 to be individually controlled without the need for individually addressable LEDs, which enables more functional and aesthetically pleasing options for a relatively low cost.

Figure 4B:
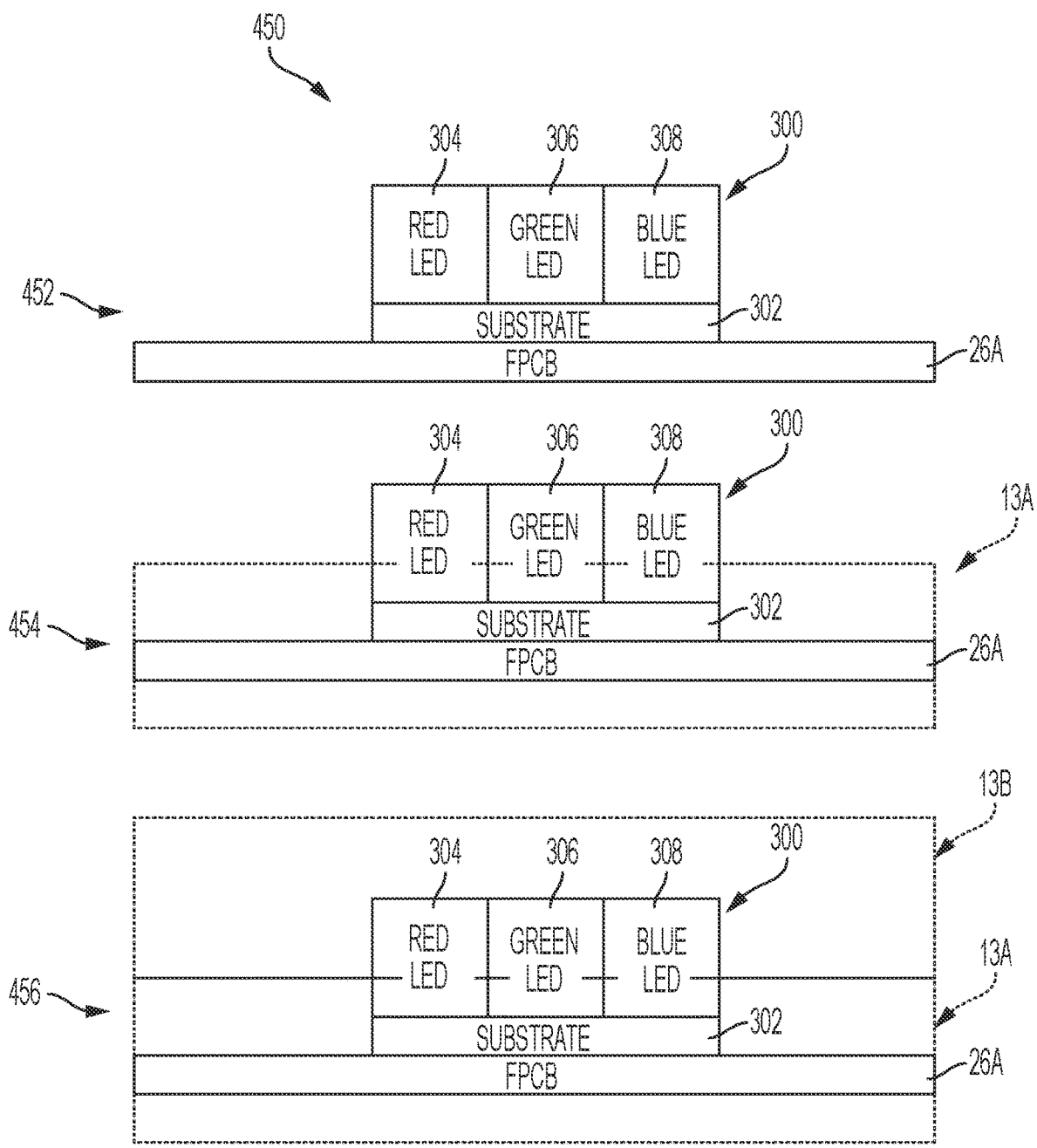
FIG. 4B is a series of illustrations depicting the manufacturing of the eyewear of FIG. 4A.

FIG. 4B is a series of illustrations depicting example steps 450 for manufacturing eyewear 12 (see FIG. 4A) with multi-color LEDs 300 (FIG. 3) on an FPCB. In a first step 452, a robotic device positions and mounts the LEDs 300 (e.g., by soldering, adhering, etc.) onto a portion of FPCB 26A. For example, the robotic device may position LED 300 and other LEDs at periodic locations on FPCB 26A to produce the configuration shown in FIG. 4A. In a second step 454, an injection molding device partially embeds the LED 300 and FPCB 26A into one-half 13A (e.g., back half) of frame 16 during the first shot of the two-shot molding process. In a third step 456, the injection molding device fully embeds LED 300 and FPCB 26A into frame 16 between first half 13A and second half 13B during a second shot of the two-shot molding process. At least frame section 13B is composed of transparent or translucent material that allows light emitted from LED 300 to escape frame 16 and be visible to the user and/or bystanders.

Minimizing power consumption is important when illuminating eyewear 12 to preserve battery life. To reduce power consumption during operation, control electronics 20A (e.g., controller 100) send (e.g., periodically or at the request of the user) the electrical signal to the LEDs 300 via the FPCBs rather than continuously applying a signal to reduce power consumption. For example, the user may initiate the illumination of LEDs 300 by pressing a button (e.g., button 32) on eyewear 12. Controller 100 energizes LEDs 300 for periods of time and de-energizes LEDs 300 for other periods of time. This allows controller 100 to periodically illuminate the LEDs while reducing overall power consumption.

Figure 5A:
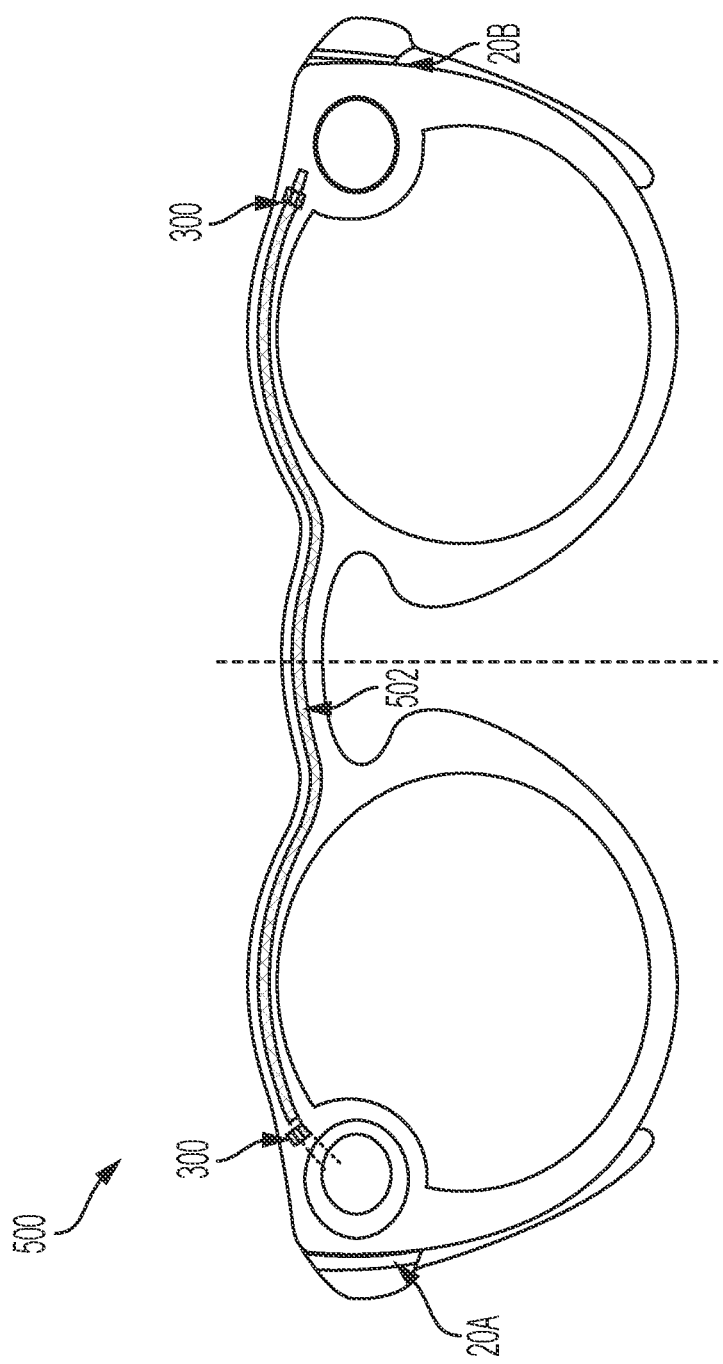
FIG. 5A is a front view of the eyewear example of FIG. 1A showing LEDs and a light tube positioned in the frame.

As shown in FIG. 4A, LEDs 300 are evenly spaced in frame 16. Other configurations for illuminating eyewear 12 are possible. For example, FIG. 5A depicts a close-up partial view of eyewear 12 in FIG. 1C, where a light pipe 502 extends from LEDs 300 positioned on opposite sides of the frame. In this configuration, one LED 300 is on each side of frame 16, with electrical coupling to respective electronics 20A and 20B via FPCB 26A and FPCB 26B. Unlike FIG. 4A, however, LEDs 300 are not present over the entire length of the brow portion of frame 16. Rather the light pipe 502 extends the length of the brow portion of frame 16 between the LEDs 300 to provide illumination throughout the brow portion. In one example, light pipe 502 is an optical tube (e.g., tubular shaped optical diffuser) having optical surfaces that guide and diffuse light emitted from LEDs 300 throughout the entire length of frame 16, such that the light is dispersed evenly throughout frame 16. This configuration reduces the number of LEDs required to illuminate frame 16, while providing more uniform illumination across the surface of the frame.

As described above, FIG. 4A shows an example where LEDs 300 face the front portion of frame 16 (i.e. aimed away from the user's face). In FIG. 5A, however, LEDs 300 do not have to have the same orientation. Specifically, in a light pipe 502 implementation, LEDs 300 have an orientation facing the light pipe 502. For example, LED 300 on the left side of the frame faces the left end of light pipe 502. The other LED 300 on the right side of the frame faces the right end of light pipe 502. The use of a light pipe 502 may significantly reduce the number of LEDs required to illuminate frame 16.

Other embodiments using light pipe 402 are possible. For example, FIG. 5A may only use one LED 300 to illuminate light pipe 402. In another example, light pipe 402 may extend along other regions of frame 16 (e.g., regions encircling the optical lenses).

FPCB 26A electrically couple LEDs 300 in FIG. 5A to controller 100. Similar to FIG. 4A above, these electrical couplings may include a common trace or individual traces on FPCB 26A. In addition, LEDs 300 optically couple to light pipe 502. This may require a change in LED orientation as compared to FIG. 4A.

Figure 5B:
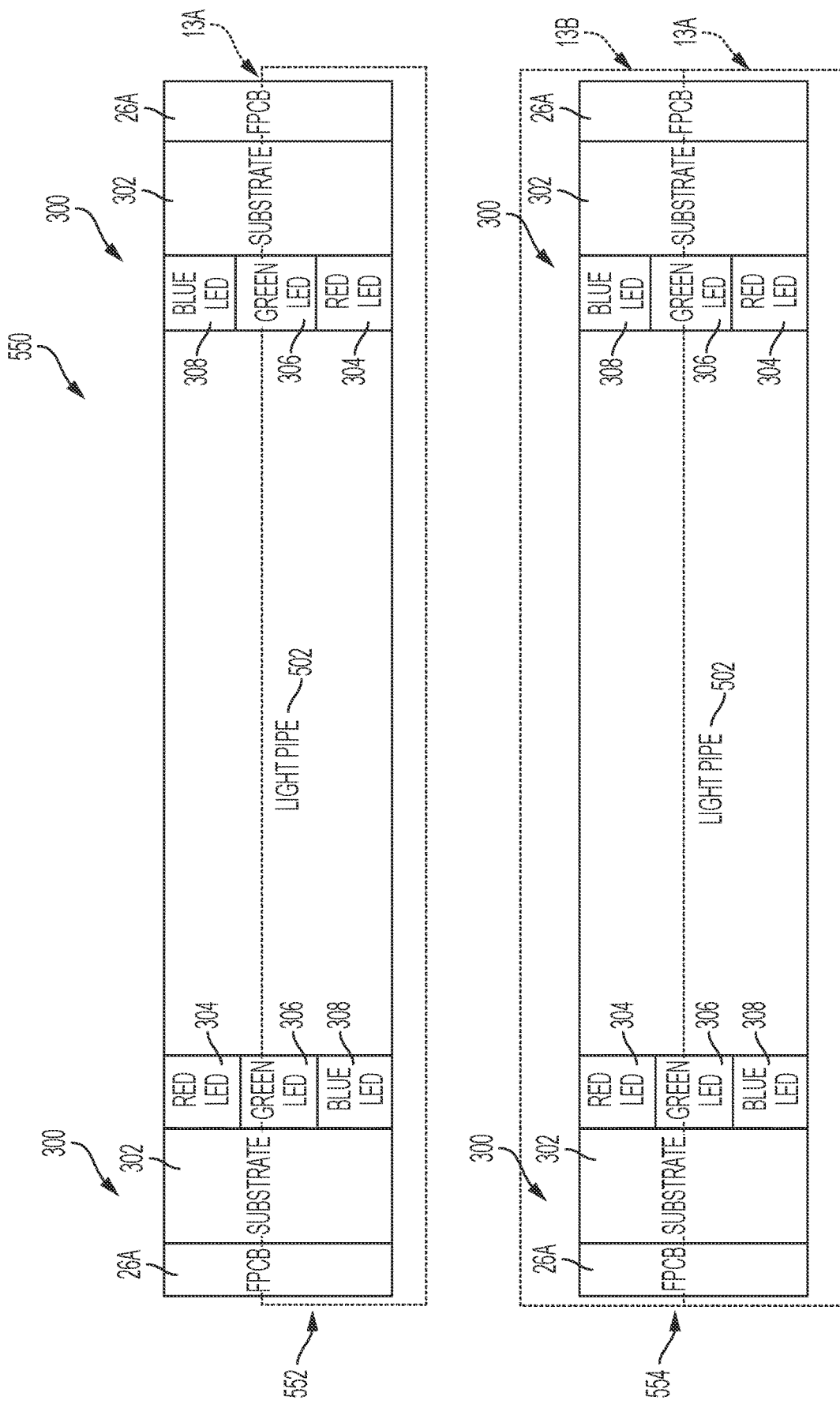
FIG. 5B is a series of illustrations depicting the manufacturing of the eyewear of FIG. 5A.

FIG. 5B shows a series of illustrations depicting example steps 550 for installing LEDs 300 on FPCBs and coupling LEDs 300 to light pipe 402 during the manufacture of eyewear 12 (see FIG. 5A). In a first step 552, a robotic device mounts LEDs 300 (e.g., via soldering, adhering, etc.) onto a portion of FPCB 26A on opposite sides of frame 16 and positions light pipe 502; and an injection-molding device injects molding material to form one half 13A (e.g., the back half) of frame 16, during the first shot of the two-shot molding process. In a second step 554, the injection molding device injects additional molding material to form a second half 13B (e.g., the front half), which fully embeds LEDs 300, light pipe 402 and FPCB 26A into frame 16 between half 13A and half 13B, during the second shot of the two-shot molding process. At least frame section 13B is composed of transparent or translucent material that allows light from light pipe 402 to escape frame 16.

Figure 6A:
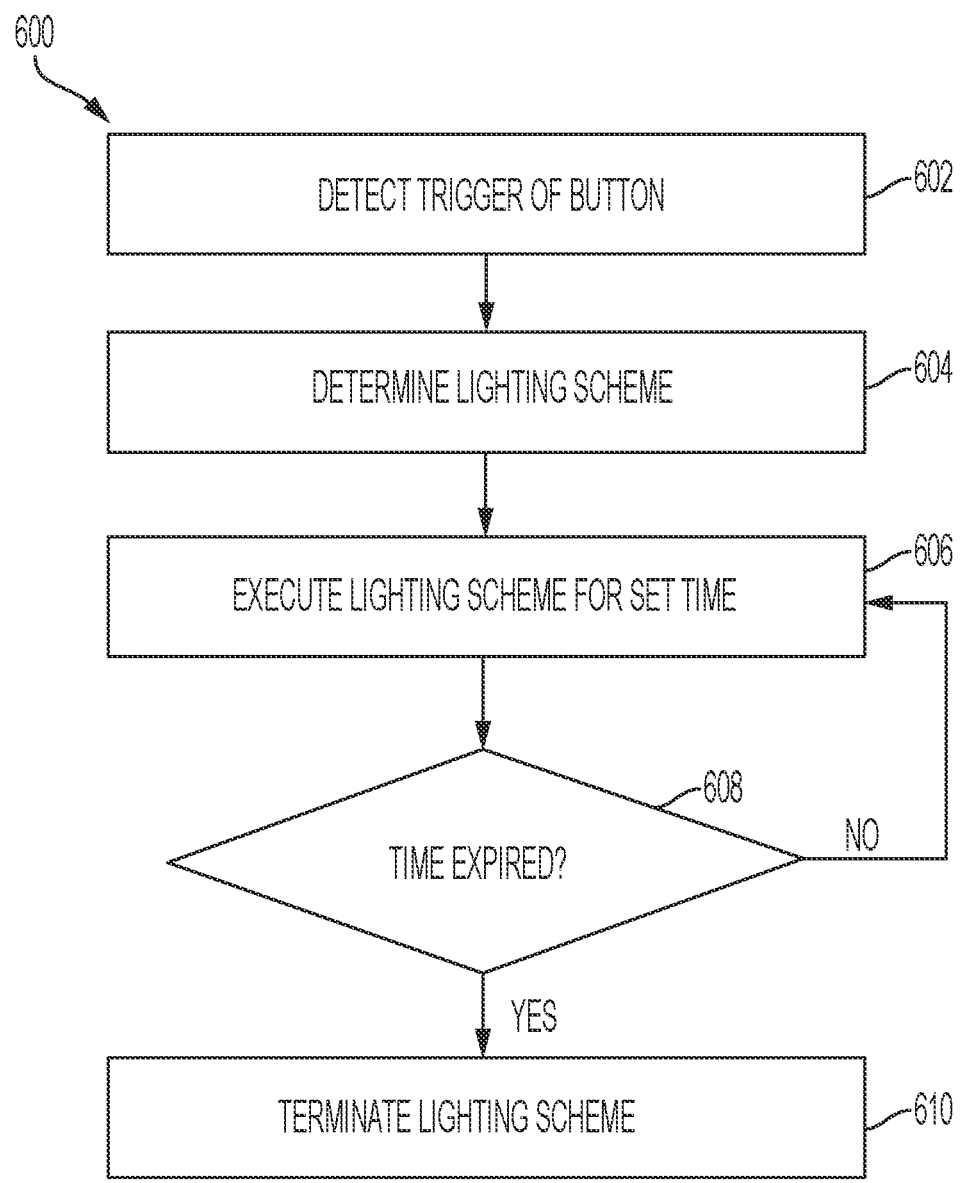
FIG. 6A is a flowchart showing an example of the operation of eyewear having LEDs.

FIG. 6A depicts a flow chart 600 illustrating the operation of eyewear 12 (FIG. 1) in which a particular lighting scheme is triggered by a button. In step 602, controller 100 detects the trigger resulting from a press of button 110. This may indicate to controller 100 that the user wants to capture an image or video using camera 112, or it may indicate to controller 100 that the user wants to illuminate eyewear 12. Controller 100 may analyze the number of times that button 110 is triggered, or the duration of the press to determine the desired functionality.

For example, each press of button 110 may instruct controller 100 to illuminate eyewear 12 for a predetermined amount of time (e.g., 10 seconds). This predetermined amount of time may coincide with functionality of eyewear 12, such as capturing a video (e.g., where desirable to illuminate eyewear 12 when capturing video). For example, if the user presses the button once, then controller 100 illuminates eyewear 12 for 10 seconds. If the user presses the button twice in a row, then controller 100 illuminates eyewear 12 for 20 seconds.

In another example, the duration of the button 110 press instructs controller 100 to illuminate eyewear 12 for a predetermined amount of time (e.g., 30 seconds). For example, if the user presses and holds the button for 5 seconds, then controller 100 illuminates eyewear 12 for 30 seconds while capturing 30 seconds of video.

Once the user triggers button 110, in step 604, controller 100 determines a lighting scheme (color, duration, flashing/chasing pattern, etc.). The lighting scheme may be selected from a plurality of lighting schemes stored in memory of eyewear or received from a software application executing on, for example, a personal computing device (e.g., smartphone 50).

After controller 100 determines the appropriate lighting scheme, in step 606, controller 100 executes the lighting scheme by, for example, sending a control signal(s), via FPCB 26A to LEDs 300 embedded in eyewear 12. In step 608, controller 100 monitors the illumination time of LEDs 300. If a predetermined time has not expired, then controller 100 continues executing the lighting scheme. If, however, the lighting scheme has expired, then controller 100, in step 610, terminates presentation of the lighting scheme.

Figure 6B:
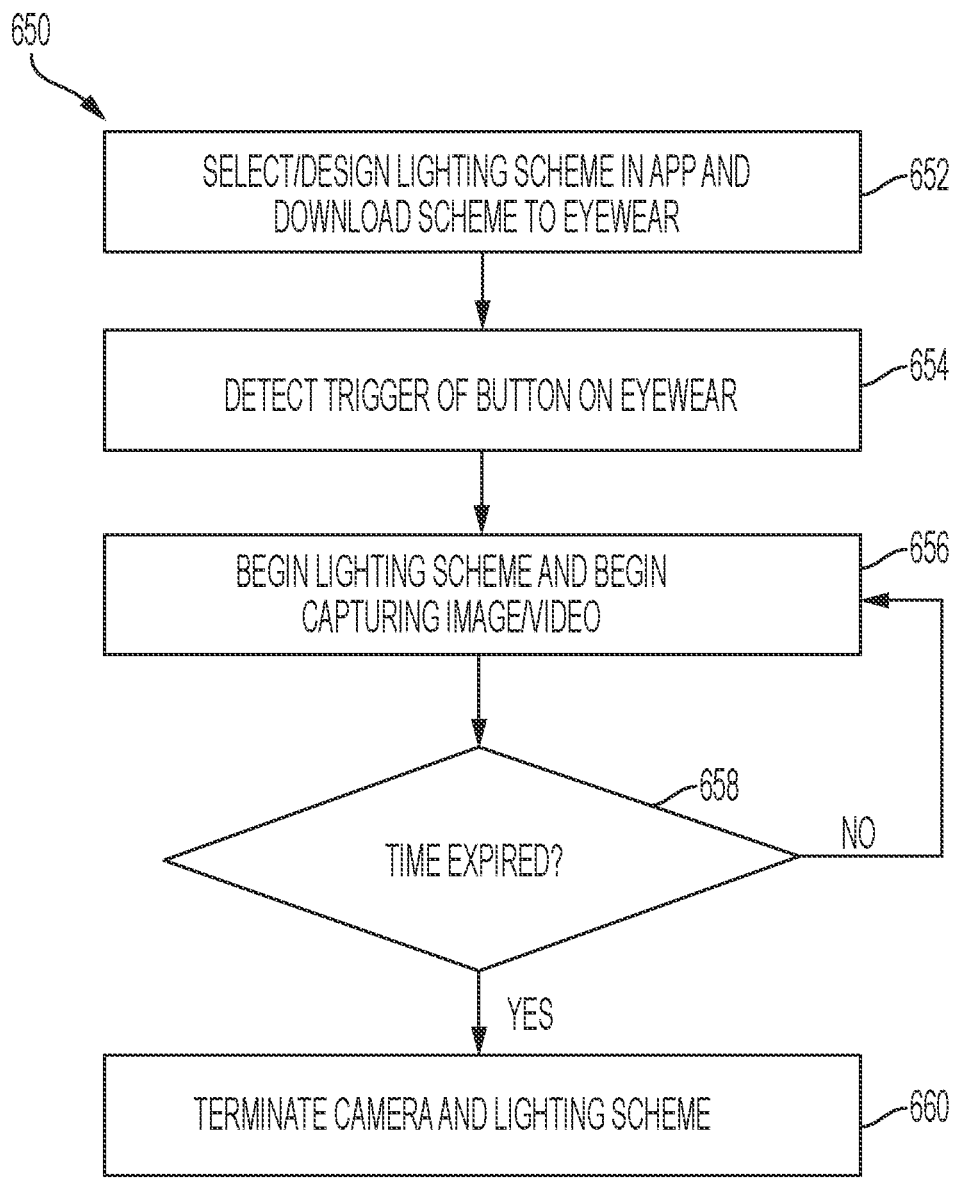
FIG. 6B is a flowchart showing another example of the operation of eyewear having LEDs.

FIG. 6B depicts a flow chart 650 illustrating the operation of eyewear 12 (FIG. 1) in which the lighting scheme is selected and then triggered by a button 110. In step 652, the lighting scheme is designed or selected in a software application, e.g., running on a personal computing device such as a smartphone. For example, a smartphone application may allow the user to select various parameters of a lighting scheme including but not limited to color, duration, flashing/chasing patterns, areas of the frame to illuminate, triggers for illumination, etc.) Once the user or software application designs or selects the lighting pattern, it is downloaded to controller 100 of eyewear 12.

In one example, a user opens a software application on smartphone 50 for controlling the lighting scheme. The application may display several options to the user for creating one or more personalized custom lighting scheme for their eyewear. Once the user creates their custom lighting scheme(s), wireless module 102 downloads the scheme(s) to eyewear 12 for storage in memory 106.

Controller 100 then determines the desired lighting scheme by accessing memory 106. Memory 106 may include multiple unique lighting schemes, as well as instructions on when and how to implement these schemes. For example, memory 106 may include three lighting schemes along with implementation instructions. The instructions may instruct controller 100 to illuminate eyewear 12 according to the first lighting scheme when the user presses a particular button once. The instructions may also instruct controller 100 to illuminate eyewear 12 according to the second lighting scheme when the user presses the button twice in a row.

In step 654, controller 100 detects the trigger of button 110. This may indicate to controller 100 that the user wants to capture an image or video using camera 112, or it may indicate to controller 100 that the user wants to illuminate eyewear 12.

For example, each press of button 110 may instruct controller 100 to illuminate eyewear 12 for a predetermined amount of time. This predetermined amount of time coincides with the capturing a video or an image. For example, if the user presses the button once, then controller 100 illuminates eyewear 12 while the camera captures the image. In another example, the duration in which button 110 is depressed, may instruct controller 100 to illuminate eyewear 12 for a predetermined amount of time while a video is recorded by the camera. For example, if the user presses and holds the button for 3 seconds, then controller 100 illuminates eyewear 12 for 10 seconds while capturing 10 seconds of video.

In either case, in step 656, controller 100 executes the lighting scheme by sending a control signal(s), via FPCB 26A to LEDs 300 embedded in eyewear 12. In step 658, controller 100 monitors the illumination time of LEDs 300. If a predetermined time has not expired, then controller 100 continues executing the lighting scheme. If, however, the lighting scheme has expired, then in step 660, controller 100 terminates the lighting scheme. As mentioned above, the illumination time may coincide with functionality of eyewear 12 (e.g., the frames remain illuminated when the camera records a video or an image). Thus, the controller synchronizes the lighting scheme with the operation of camera 112.

Although the description and figures of the disclosure focus on the implementation LEDs in the frame of the eyewear, other configurations are possible. In one example, LEDs and/or light pipes (not shown) have locations in other portions of eyewear 12 such as frames 14A/14B and in areas of frame 16 surrounding the optical lenses. In addition, controller 100 illuminates these sections either individually or simultaneously depending on the user's preferences. In addition, controller 100 controls each section based on a distinct lighting pattern.

Controller 100 may or may not synchronize the lighting scheme of eyewear 12 with the operation of camera 112. In one example, the lighting scheme turns ON and OFF with the operation of camera 112 to indicate to the user and to bystanders that camera 112 is operational. In another example, the light scheme is independent of the operation of camera 112, and controller 100 may initiate the lighting scheme for purely aesthetic reasons.

As mentioned above, a software application running on smartphone 50 may control the lighting scheme. Options presented by the software to the user include color options, timing options, flashing/chasing options, triggering options, etc. The software application provides the user with an interface to select predefined lighting schemes or to design their own unique lighting schemes.

The steps in FIGS. 6A and 6B may be performed by controller 100 of the electronic components upon loading and executing software code or instructions which are tangibly stored on a tangible computer readable medium, such as on a magnetic medium, e.g., a computer hard drive, an optical medium, e.g., an optical disc, solid-state memory, e.g., flash memory, or other storage media known in the art. Thus, any of the functionality performed by the controller described herein, such as the steps in FIGS. 6A and 6B, may be implemented in software code or instructions that are tangibly stored on a tangible computer readable medium. Upon loading and executing such software code or instructions by the controller, the controller may perform any of the functionality of the controller described herein, including the steps in FIGS. 6A and 6B described herein.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus, the following claims are hereby incorporated into the Detailed Description, with each claim standing on its own as a separately claimed subject matter.

While the foregoing has described what are considered to be the best mode and other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

The invention claimed is:

1. Eyewear comprising:
   light emitting diodes (LEDs);
   a support structure configured to support the LEDs, the LEDs positioned on the support structure to illuminate the eyewear;
   a memory; and
   a processor coupled to the LEDs and the memory, the processor configured to:
   store a custom lighting scheme and an associated trigger in the memory for illuminating the LEDs,
   detect the associated trigger, and
   sending control signals to the LEDs to illuminate in accordance with the custom lighting scheme in response to the detected associated trigger.

2. The eyewear of claim 1, wherein the eyewear further comprises:
   a button supported by the support structure and coupled to the processor, wherein the associated trigger includes a button press sequence performed using the button.

3. The eyewear of claim 2, wherein the button press sequence includes a single press of the button.

4. The eyewear of claim 1, wherein the processor is further configured to:
   store a second custom lighting scheme and an associated second trigger in the memory for illuminating the LEDs;
   detect the associated second trigger; and
   send second control signals to the LEDs to illuminate in accordance with the second custom lighting scheme in response to the detected associated second trigger.

5. The eyewear of claim 4, wherein the eyewear further comprises:
   a button supported by the support structure and coupled to the processor, wherein the associated trigger includes a first button press sequence performed using the button and the second associated trigger includes a second button press sequence performed using the button.

6. The eyewear of claim 5, wherein the first button press sequence includes a single press of the button and the second button press sequence includes multiple presses of the button.

7. The eyewear of claim 1, wherein the custom lighting scheme comprises one or more user selections defining one or more of color, duration, patterns, areas of the support structure to illuminate the LEDs.

8. The eyewear of claim 1, further comprising:
   an optical element;
   wherein the support structure is further configured to support the optical element.

9. An eyewear illumination method for illuminating eyewear, the method comprising:
   receiving a custom lighting scheme and an associated trigger;

storing the custom lighting scheme and the associated trigger in a memory for illuminating light emitting diodes (LEDs) of the eyewear;

detecting the associated trigger; and sending control signals to the LEDs to illuminate in accordance with the custom lighting scheme in response to the detected associated trigger.

10. The eyewear illumination method of claim 9, wherein the associated trigger includes a button press sequence performed using a button of the eyewear.

11. The eyewear illumination method of claim 10, wherein the button press sequence includes a single press of the button.

12. The eyewear illumination method of claim 9, wherein the method further comprises:

receiving a second custom lighting scheme and an associated second trigger;

storing the second custom lighting scheme and the associated second trigger in the memory for illuminating the LEDs;

detecting the associated second trigger; and sending second control signals to the LEDs to illuminate in accordance with the second custom lighting scheme in response to the detected associated second trigger.

13. The eyewear illumination method of claim 12, wherein the associated trigger includes a first button press sequence performed using a button of the eyewear and the second associated trigger includes a second button press sequence performed using the button.

14. The eyewear illumination method of claim 13, wherein the first button press sequence includes a single press of the button and the second button press sequence includes multiple presses of the button.

15. The eyewear illumination method of claim 9, further comprising:

receiving one or more user selections for one or more of color, duration, or patterns to define the custom lighting scheme.

16. A non-transitory computer readable storage medium including instructions for illuminating eyewear, the instructions, when executed by a processor, configure the eyewear to perform functions including:

receiving a custom lighting scheme and an associated trigger;

storing the custom lighting scheme and the associated trigger in a memory for illuminating light emitting diodes (LEDs) of the eyewear;

detecting the associated trigger; and sending control signals to the LEDs to illuminate in accordance with the custom lighting scheme in response to the detected associated trigger.

17. The non-transitory computer readable storage medium of claim 16, wherein the associated trigger includes a button press sequence performed using a button of the eyewear.

18. The non-transitory computer readable storage medium of claim 17, wherein the button press sequence includes a single press of the button.

19. The non-transitory computer readable storage medium of claim 16, wherein the instructions, when executed by the processor, further configure the eyewear to perform additional functions including:

receiving a second custom lighting scheme and an associated second trigger;

storing the second custom lighting scheme and the associated second trigger in the memory for illuminating the LEDs;

detecting the associated second trigger; and sending second control signals to the LEDs to illuminate in accordance with the second custom lighting scheme in response to the detected associated second trigger.

20. The non-transitory computer readable storage medium of claim 19, wherein the associated trigger includes a first button press sequence performed using a button of the eyewear and the second associated trigger includes a second button press sequence performed using the button.

* * * * *